(12) United States Patent
Motoyama et al.

(10) Patent No.: US 10,801,128 B2
(45) Date of Patent: Oct. 13, 2020

(54) SIC EPITAXIAL GROWTH APPARATUS

(71) Applicant: SHOWA DENKO K.K., Tokyo (JP)

(72) Inventors: Yasunori Motoyama, Tokyo (JP);
Yoshishige Okuno, Chiba (JP);
Yoshikazu Umeta, Chichibu (JP);
Keisuke Fukada, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 150 days.

(21) Appl. No.: 16/196,246

(22) Filed: Nov. 20, 2018

(65) Prior Publication Data
US 2019/0161885 A1    May 30, 2019

(30) Foreign Application Priority Data
Nov. 24, 2017    (JP) ................... 2017-225658

(51) Int. Cl.
| | | |
|---|---|---|
| *C23C 16/46* | (2006.01) | |
| *C30B 25/10* | (2006.01) | |
| *C30B 29/36* | (2006.01) | |
| *C30B 25/12* | (2006.01) | |

(52) U.S. Cl.
CPC ............ *C30B 25/105* (2013.01); *C23C 16/46* (2013.01); *C30B 25/12* (2013.01); *C30B 29/36* (2013.01)

(58) Field of Classification Search
CPC ....... C23C 16/46; C30B 25/105; C30B 25/12; C30B 29/36
See application file for complete search history.

(56) References Cited

U.S. PATENT DOCUMENTS

| | | | | |
|---|---|---|---|---|
| 6,001,175 A | * | 12/1999 | Maruyama | .............. C30B 25/10 117/102 |
| 6,758,902 B2 | * | 7/2004 | Schupp | ................... C30B 11/00 117/200 |
| 6,786,969 B2 | * | 9/2004 | Kondo | .................... C30B 23/00 117/200 |

(Continued)

FOREIGN PATENT DOCUMENTS

| | | |
|---|---|---|
| JP | 2010-129764 A | 6/2010 |
| JP | 2012-044030 A | 3/2012 |

(Continued)

OTHER PUBLICATIONS

Wellman, Peter, et al., "Growth of SiC bulk crystals for application in power electronic devices—process design, 2D and 3D X-ray in situ visualization and advanced doping". Cryst. Res. Technol. 50, No. 1, 2-9 (2015) / DOI 10.1002/crat.201400216.*

(Continued)

*Primary Examiner* — Bret P Chen
(74) *Attorney, Agent, or Firm* — Sughrue Mion, PLLC

(57) ABSTRACT

A SiC epitaxial growth apparatus includes: a susceptor having a mounting surface on which a wafer is placable; a heater which is provided apart from the susceptor on a side opposite to the mounting surface of the susceptor; and an annular radiation member which is in contact with a back surface of the susceptor opposite to the mounting surface and is located at a position which is overlapped with an outer peripheral portion of the wafer placed on the susceptor in a plan view, in which the radiation member has a higher emissivity than that of the susceptor and has an exposed portion as viewed from the heater.

11 Claims, 10 Drawing Sheets

(56) References Cited

U.S. PATENT DOCUMENTS

| | | | | |
|---|---|---|---|---|
| 2006/0228473 | A1* | 10/2006 | Satoh | B08B 7/0035 |
| | | | | 427/248.1 |
| 2008/0019809 | A1* | 1/2008 | Takano | H01L 21/67276 |
| | | | | 414/222.01 |
| 2008/0274604 | A1* | 11/2008 | Sanchez | H01L 21/68757 |
| | | | | 438/507 |
| 2010/0055351 | A1* | 3/2010 | Kato | C23C 16/45563 |
| | | | | 427/595 |
| 2010/0181294 | A1* | 7/2010 | Tsujimoto | H01J 37/32623 |
| | | | | 219/121.41 |
| 2012/0103249 | A1* | 5/2012 | Gupta | C30B 23/005 |
| | | | | 117/89 |
| 2012/0291697 | A1* | 11/2012 | Suzuki | C23C 16/4584 |
| | | | | 117/98 |
| 2013/0280466 | A1* | 10/2013 | Zwieback | C30B 29/36 |
| | | | | 428/64.1 |
| 2014/0190400 | A1* | 7/2014 | Kageshima | C30B 29/36 |
| | | | | 117/104 |
| 2014/0230722 | A1* | 8/2014 | Kageshima | C30B 25/12 |
| | | | | 117/88 |
| 2016/0020086 | A1* | 1/2016 | Tsai | H01L 21/68742 |
| | | | | 117/89 |
| 2016/0186360 | A1* | 6/2016 | Hirose | H01L 21/02579 |
| | | | | 117/101 |
| 2017/0321345 | A1* | 11/2017 | Xu | C01B 33/025 |
| 2020/0173053 | A1* | 6/2020 | Umeta | C30B 25/14 |

FOREIGN PATENT DOCUMENTS

| | | | | |
|---|---|---|---|---|
| WO | WO 2008/089181 | * | 7/2008 | C03B 29/36 |
| WO | WO 2014/123635 | * | 8/2014 | C30B 23/00 |

OTHER PUBLICATIONS

Geiser, Jurgen, et al., "Numerical simulation of temperature fields during the sublimation growth of SiC single crystals, using WIAS-HiTNIHS". Journal of Crystal Growth 303 (2007) 352-356.*

Klein, Olaf, et al., "Transient numerical investigation of induction heating during sublimation growth of silicon carbide single crystals". Journal of Crystal Growth 247 (2003) 219-235.*

La Via, F. et al., "From thin film to bulk 3C-SiC growth: Understanding the mechanism of defects reduction". Materials Science in Semiconductor Processing 78 (2018) 57-68.*

* cited by examiner

SIC EPITAXIAL GROWTH APPARATUS

BACKGROUND OF THE INVENTION

Field of the Invention

The present invention relates to a SiC epitaxial growth apparatus.

Priority is claimed on Japanese Patent Application No. 2017-225658, filed on Nov. 24, 2017, the content of which is incorporated herein by reference.

Description of Related Art

Silicon carbide (SiC) has characteristics such that the dielectric breakdown field is larger by one order of magnitude, the band gap is three times larger, and the thermal conductivity is approximately three times higher than those of silicon (Si). Therefore, application of silicon carbide (SiC) to power devices, high-frequency devices, high-temperature operation devices and the like is expected.

In order to promote the practical application of SiC devices, it is essential to establish high-quality SiC epitaxial wafers and high-quality epitaxial growth techniques.

The SiC device is fabricated by using a SiC epitaxial wafer in which an epitaxial layer (film), which is to become an active region of the device, is grown by a chemical vapor deposition (CVD) method or the like, on a SiC single crystal substrate, wherein the crystal substrate is obtained by processing a bulk single crystal of SiC which is grown by a sublimation recrystallization method or the like. In this specification, a SiC epitaxial wafer means a wafer after an epitaxial film is formed, and a SiC wafer means a wafer before an epitaxial film is formed.

The epitaxial film of SiC grows at an extremely high temperature of about 1500° C. The growth temperature greatly affects the film thickness and properties of the epitaxial film. For example, in Patent Document 1, a semiconductor manufacturing apparatus is described which can uniformize the temperature distribution of a wafer during epitaxial growth due to a difference in thermal conductivity. In Patent Document 2, it is described that the temperature distribution of a wafer can be uniformized during epitaxial growth by supporting the wafer with a support element.

PRIOR ART DOCUMENTS

Patent Documents

Patent Document 1: Japanese Unexamined Patent Application, First Publication No. 2010-129764

Patent Document 2: Japanese Unexamined Patent Application, First Publication No. 2012-44030

SUMMARY OF THE INVENTION

Problems to be Solved by the Invention

There have been attempts to increase the size of a SiC epitaxial wafer to six inches or more. In the manufacturing of such a large SiC epitaxial wafer, the semiconductor apparatuses described in Patent Document 1 and Patent Document 2 could not sufficiently suppress a temperature difference in a wafer in an in-plane direction.

The present invention has been made taking the foregoing problems into consideration, and an object thereof is to obtain a SiC epitaxial growth apparatus capable of uniformizing a temperature distribution during epitaxial growth.

Means for Solving the Problem

As a result of intensive studies, the inventors found that the temperature of an outer peripheral portion of a wafer is lower than the temperature of a center portion. Then, it was found that a temperature distribution during epitaxial growth can be uniformized by bringing a radiation member, which is excellent in heat absorption properties and heat dissipation properties, into contact with a predetermined position on the back surface of a susceptor on which a wafer is placed.

That is, the present invention provides the following apparatus in order to solve the above problems.

(1) A SiC epitaxial growth apparatus of the first aspect includes: a susceptor having a mounting surface on which a wafer is placeable; a heater which is provided apart from the susceptor on a side opposite to the mounting surface of the susceptor; and an annular radiation member which is in contact with a back surface of the susceptor opposite to the mounting surface, and is located at a position which is overlapped with an outer peripheral portion of the wafer placed on the susceptor in a plan view, wherein the radiation member has a higher emissivity than that of the susceptor and has an exposed portion when viewed from the heater.

The apparatus of the first aspect preferably includes the following features. The following features are preferably combined with each other.

(2) In the SiC epitaxial growth apparatus according to the aspect, the heater and the wafer placed on the susceptor may be disposed concentrically with each other, and a radial distance between an outer peripheral end of the heater and an outer peripheral end of the wafer placed on the susceptor may be $1/12$ or less of a diameter of the wafer in the plan view.

(3) In the SiC epitaxial growth apparatus according to the aspect, the radiation member and the wafer placed on the susceptor may be disposed concentrically with each other, and a radial distance between an outer peripheral end of the radiation member and an outer peripheral end of the wafer placed on the susceptor may be $1/6$ or less of a diameter of the wafer in the plan view.

(4) In the SiC epitaxial growth apparatus according to the aspect, the emissivity of the radiation member may be 1.5 times or more the emissivity of the susceptor.

(5) The SiC epitaxial growth apparatus according to the aspect may further include: a center supporting element which supports a center portion of the susceptor from the back surface of the susceptor.

(6) In the SiC epitaxial growth apparatus according to the aspect, a radial width of the radiation member may be $1/10$ or more and $1/3$ or less of a radius of the wafer placed on the susceptor.

(7) In the SiC epitaxial growth apparatus according to the aspect, the radiation member may be engaged with the susceptor.

(8) The SiC epitaxial growth apparatus according to the aspect may further include: an outer periphery supporting element which supports an outer peripheral end portion of the susceptor from the back surface of the susceptor.

(9) In the SiC epitaxial growth apparatus according to the aspect, a radial width of the radiation member may be $1/200$ or more and $1/5$ or less of a radius of the wafer placed on the susceptor.

(10) In the SiC epitaxial growth apparatus according to the aspect, the radiation member may be sandwiched and held between the susceptor and the outer periphery supporting element such that a portion of the radiation member is exposed as viewed from the heater.

(11) The SiC epitaxial growth apparatus according to the aspect, an unevenness may be formed on a surface of the radiation member on the heater side.

Effects of Invention

With the SiC epitaxial growth apparatus according to the first aspect of the present invention, it is possible to uniformize a temperature distribution during epitaxial growth.

DETAILED DESCRIPTION OF THE INVENTION

Figure 1:
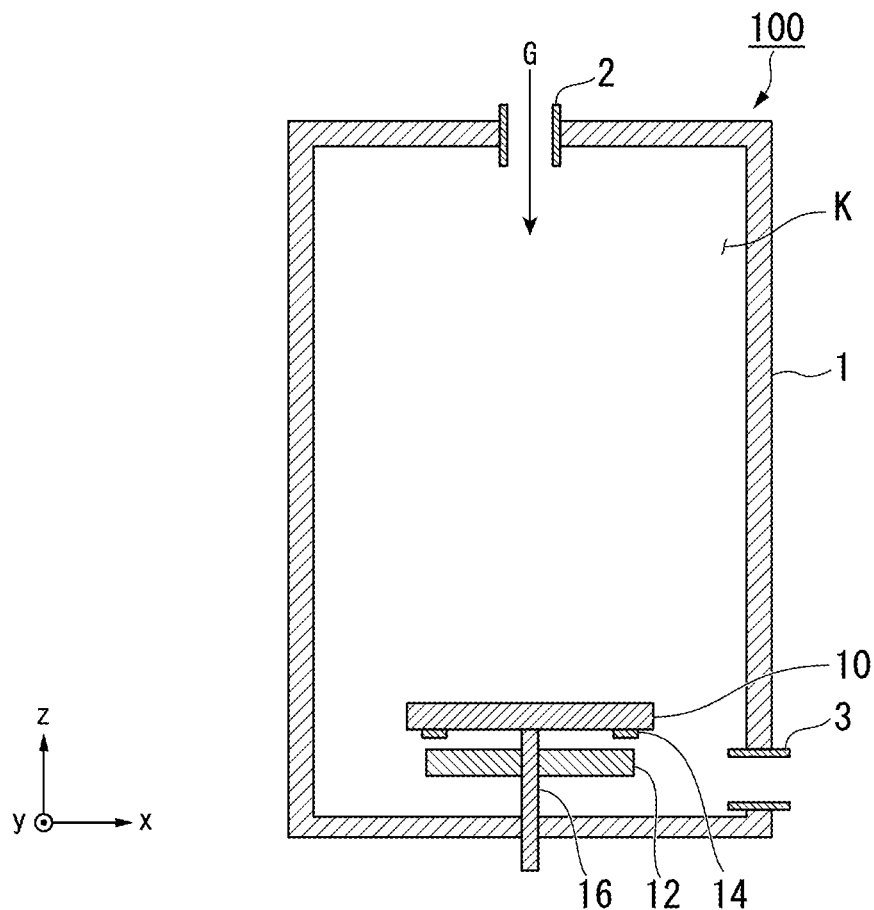
FIG. 1 is a schematic sectional view illustrating a preferable example of a SiC epitaxial growth apparatus according to a first embodiment.

Hereinafter, a SiC epitaxial growth apparatus according to the embodiments will be described in detail with reference to the drawings as appropriate. In the drawings used in the following description, for ease of understanding of the features of the present invention, there are cases where characteristic portions are enlarged for convenience, and dimensions, ratios and the like of each constituent element may be the same as or may be different from actual sizes and the like. The materials, dimensions, and the like shown in the following description are merely examples, and the present invention is not limited thereto and can be embodied in appropriately modified manners in a range that does not change the gist thereof.

First Embodiment

FIG. 1 is a schematic sectional view of a SiC epitaxial growth apparatus 100 according to a first embodiment. The SiC epitaxial growth apparatus 100 illustrated in FIG. 1 includes a chamber 1 which forms a film formation space K. The chamber 1 includes a gas supply port 2 through which gas is supplied, and a gas discharge port 3 through which the gas is discharged. In the film formation space K, a susceptor 10, a heater 12, and a radiation member 14 are provided. In addition, the susceptor 10 is supported by a center supporting element 16. Hereinafter, a direction perpendicular to a mounting surface of the susceptor 10 is referred to as a z direction, and optionally selected two directions which are orthogonal to each other on the mounting surface are referred to as an x direction and a y direction.

Figure 2:
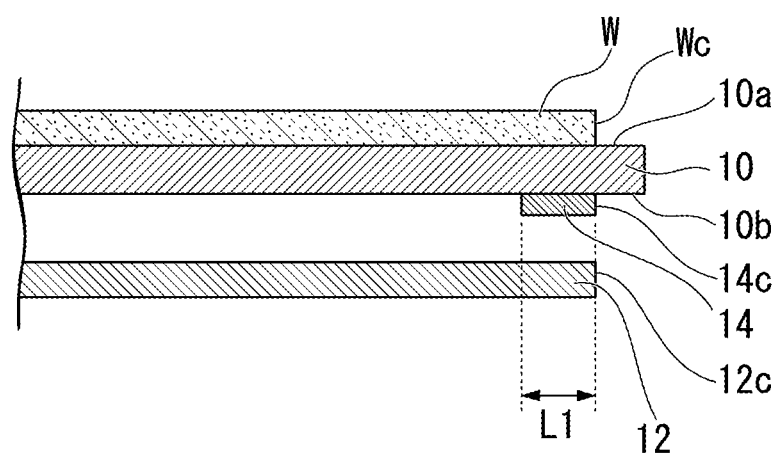
FIG. 2 is an enlarged schematic sectional view of a main part of the SiC epitaxial growth apparatus shown in FIG. 1.

FIG. 2 is an enlarged schematic sectional view of a main part of the SiC epitaxial growth apparatus 100. In FIG. 2, for ease of understanding, a disk-shaped wafer W, which is not a constituent member of the apparatus, is also illustrated.

The wafer W can be placed on a mounting surface 10a of the susceptor 10. Any known susceptor can be used as the susceptor 10. The susceptor 10 may have a circular shape in a plan view. The susceptor 10 is formed of a material which has heat resistance at a high temperature exceeding 1500° C. and has low reactivity with a raw material gas. For example, Ta, TaC, carbon coated with TaC, Ta coated with TaC, and graphite can be used. In a film formation temperature region, the emissivity of TaC and carbon coated with TaC is about 0.2 to 0.3, and the emissivity of graphite is about 0.7.

The heater 12 is provided apart from the susceptor 10 at a back surface 10b side of the susceptor 10, which is opposite to the mounting surface 10a. Any known heater can be used as the heater 12. The heater 12 may have a circular shape in a plan view. It is preferable that the heater 12 is disposed concentrically with the susceptor 10 and the wafer W in the plan view observed from the z direction. By disposing the heater 12 concentrically with the susceptor 10 and the wafer W on the same center axis, the thermal uniformity of the wafer W can be enhanced.

It is preferable that the radial distance between an outer peripheral end 12c of the heater 12 and an outer peripheral end Wc of the wafer W is equal to or less than $1/12$ of the diameter of the wafer W, and more preferably equal to or less than $1/20$. Furthermore, it is more preferable that the outer peripheral end 12c of the heater 12 and the outer peripheral end Wc of the wafer W coincide in the plan view observed from the z direction. When the radial size of the heater 12 is smaller than that of the wafer W, the thermal uniformity of the surface temperature of the wafer W decreases. In addition, when the radial size of the heater 12 is larger than that of the wafer W, the heater 12 protrudes in a radially outward direction in the plan view observed from the z direction, resulting in an increase in the size of the SiC epitaxial growth apparatus 100. An increase in the size of the apparatus results in an increase in cost and is thus undesirable.

The radiation member 14 is formed of a material having a higher emissivity than the susceptor 10. The emissivity of the radiation member 14 is preferably 1.5 times or more and 7 times or less the emissivity of the susceptor 10. For example, in a case where the susceptor 10 is formed from carbon coated with TaC (emissivity: 0.2), graphite (emissivity: 0.7), carbon coated with SiC (emissivity: 0.8), SiC (emissivity: 0.8) or the like is preferably used as the radiation member 14. The emissivity is equivalent to heat absorption rate, and the radiation member 14 readily absorbs heat compared to the susceptor 10 and the like. That is, the radiation member 14 has a higher heat absorbing property than the susceptor 10 and the like. As the emissivity, a value of emissivity may be obtained from a literature in which an emissivity table or the like is described, or the emissivity may be obtained by conducting an experiment using a radiation thermometer, a contact thermometer, and/or a black body spray and a tape and the like.

The radiation member 14 is an annular member having an opening at the center. The radiation member 14 is located at a position overlapping the outer peripheral portion of the wafer W in the plan view observed from the z direction. Here, the outer peripheral portion of the wafer W means a circular region which has a width of 10% of the diameter of the wafer and is located from the outer peripheral end Wc of the wafer W toward the inside. The radiation member 14 may overlap at least a portion of the outer peripheral portion of the wafer W in the plan view observed from the z direction. Since the radiation member 14 having excellent heat absorbing property is disposed on the outer peripheral side of the wafer W, it is possible to suppress a decrease in the temperature of the outer peripheral portion of the wafer W compared to the center portion.

The radiation member 14 is in contact with the back surface 10b of the susceptor 10 such that a portion of the radiation member is exposed to the space, when viewed from the side where the heater 12 is provided. Since the portion of the radiation member 14 is exposed, radiant heat generated from the heater 12 can be efficiently absorbed in the radiation member. The other portion of the radiation member 14 which is not exposed to the space is in contact with the susceptor 10 directly or via an adhesive or the like. Furthermore, since the upper surface of the radiation member 14 is in contact with the back surface 10b of the susceptor 10, the temperature of the outer peripheral portion of the wafer W can be increased due to thermal conduction. In a case where the radiation member 14 is not in contact with the back surface 10b of the susceptor 10, the temperature of the outer peripheral portion cannot be sufficiently increased. It is considered that this is because the radiation member 14 shields part of the radiation emitted toward the back surface 10b of the susceptor 10 and thus the heat absorption efficiency decreases. In addition, it is also considered that this is because heat absorbed by the radiation member 14 cannot be efficiently transferred to the susceptor 10 when the susceptor 10 and the radiation member 14 are not in contact with each other.

It is preferable that the radial distance between an outer peripheral end 14c of the radiation member 14 and the outer peripheral end Wc of the wafer W is equal to or less than $1/6$ of the diameter of the wafer W, and more preferably equal to or less than $1/20$. Furthermore, it is more preferable that the outer peripheral end 14c of the radiation member 14 and the outer peripheral end Wc of the wafer W coincide in the plan view observed from the z direction. At the time of epitaxial growth, the outer peripheral end Wc has a low temperature in a plane of the wafer W. When the radiation member 14 is located at a position close to the outer peripheral end Wc of the wafer W, a decrease in the temperature of the outer peripheral end Wc of the wafer W can be suppressed.

In a case where the susceptor 10 is supported by the center supporting element 16, a radial width L1 of the radiation member 14 is preferably $1/10$ or more and $1/3$ or less of the radius of the wafer W, and may be $1/10$ or more and less than $1/6$, or $1/6$ or more and $1/3$ or less as necessary. When the radial width L1 of the radiation member 14 is in the above range, the temperature of the wafer W in an in-plane direction can be made more uniform.

The radiation member 14 may be bonded to the back surface 10b of the susceptor 10 and/or may be engaged with the susceptor 10.

Figure 3:
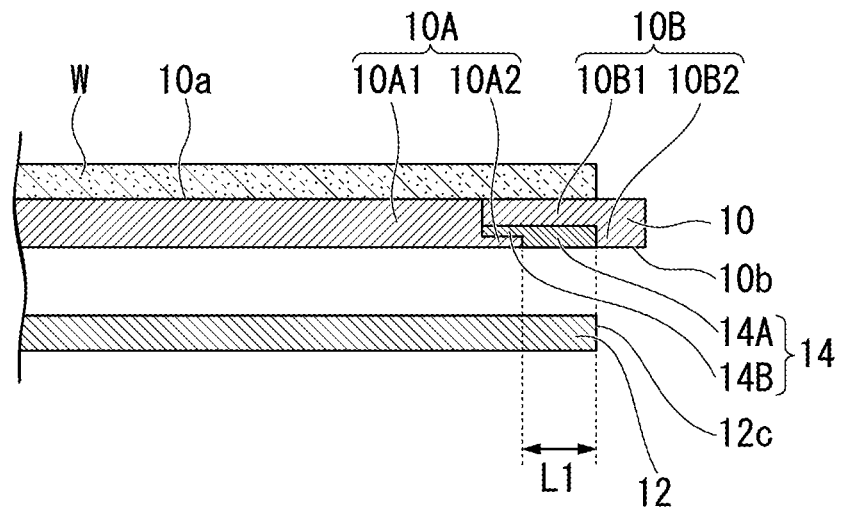
FIG. 3 is a schematic sectional view illustrating another preferable example of the SiC epitaxial growth apparatus according to the first embodiment, and is an enlarged view of a main part in which a radiation member is engaged with a susceptor.

FIG. 3 is an enlarged schematic view of a main part of the SiC epitaxial growth apparatus according to the first embodiment in an example in which the radiation member 14 is engaged with the susceptor 10.

The susceptor 10 illustrated in FIG. 3 is constituted by a first member 10A and a second member 10B. The first member 10A includes a main portion 10A1 and a protruding portion 10A2. The protruding portion 10A2 protrudes from the main portion 10A1 in the radial direction (x direction). The second member 10B includes a main portion 10B1 and a protruding portion 10B2. The protruding portion 10B2 protrudes from the main portion 10B1 in the z direction. The first member 10A and the second member 10B are preferably formed using the same material.

The radiation member 14 is also constituted by a first portion 14A and a second portion 14B. The first portion 14A is a main portion of the radiation member 14, and the second portion 14B extends from the first portion 14A in the radial direction. The second portion 14B of the radiation member 14 is engaged into a gap provided between the protruding portion 10A2 of the first member 10A and the main portion 10B1 of the second member 10B. A lower portion of the first portion 14A of the radiation member 14 is sandwiched between the protruding portion 10A2 of the first member 10A and the protruding portion 10B2 of the second member 10B. The radiation member 14 is supported by the susceptor 10 by its own weight of the radiation member 14. In this case, the radial width L1 of the radiation member 14 means a width of a portion of the radiation member 14 which is exposed to the back surface 10b side of the susceptor 10. When the radiation member 14 and the susceptor 10 can be joined together without using an adhesive, adhesive is not required. Although it is possible to use an adhesive for them, there are cases where peeling of the adhesive occurs due to stress which occurs by a difference of linear thermal expansion coefficients thereof. Therefore, it is desirable that the radiation member 14 is fixed by a method which does not use an adhesive. Due to the supporting structure described above, an adhesive may be used or may not be used between the radiation member 14 and the susceptor 10.

Figure 4:
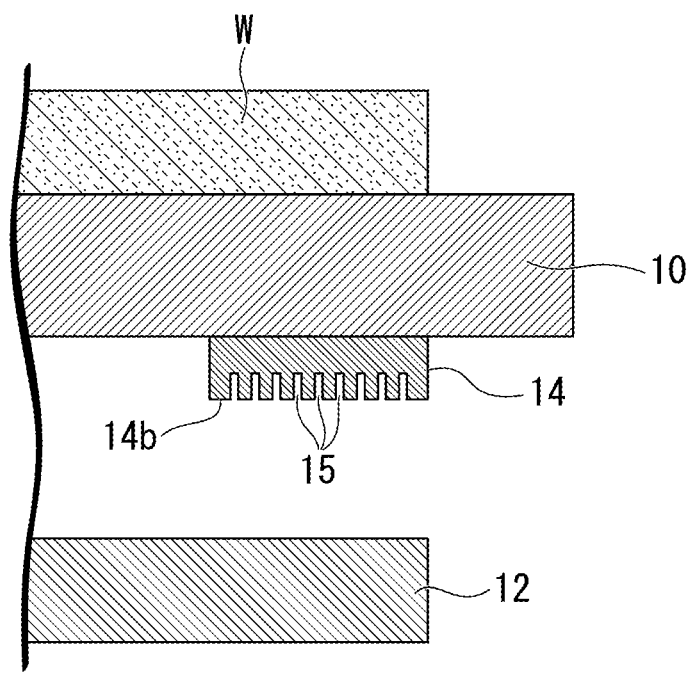
FIG. 4 is a schematic sectional view illustrating another preferable example of the SiC epitaxial growth apparatus according to the first embodiment, and is an enlarged view of a main part in which an unevenness is formed on one surface of the radiation member.

FIG. 4 is an enlarged schematic view of a main part of the SiC epitaxial growth apparatus according to the first embodiment in an example in which an uneven shape is formed on a surface 14b (lower surface) of the radiation member 14. As illustrated in FIG. 4, the radiation member 14 includes a plurality of recessed portions 15 (valley portions) between a plurality of protruding portions (hill portions or projecting portions) on the surface 14b which faces the heater 12. When the uneven shape is formed on the surface 14b of the radiation member 14, an effective emissivity of the radiation member 14 increases. This is because the area that can absorb radiation (radiant heat) sent from the heater 12 is widened due to the unevenness. When the actual area of the surface 14b of the radiation member 14 is expressed by $S_1$ and the area of a flat surface wherein the surface 14b of the radiation member 14 is assumed to be a flat surface is expressed by $S_0$, the area ratio ($S_1/S_0$) is preferably 2 or more, more preferably 8 or more, and even more preferably 16 or more.

Furthermore, the aspect ratio of the recessed portion 15 (the depth of the recessed portion/the width of the recessed portion in the plan view) is preferably 1 or more, and more preferably 5 or more. When the aspect ratio of the recessed portion 15 is large, radiation entered in the recessed portion 15 cannot escape from the recessed portion 15, so that the heat absorption efficiency can be further increased.

Figure 5A:
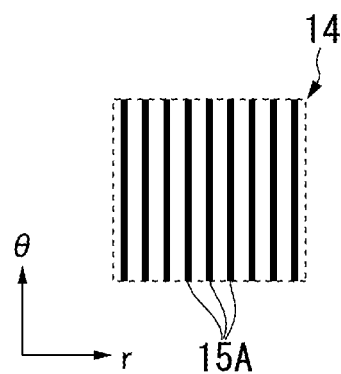
FIG. 5A is a schematic view illustrating a preferable example of the radiation member of the SiC epitaxial growth apparatus, and is a plan view of one surface side thereof.
Figure 5B:
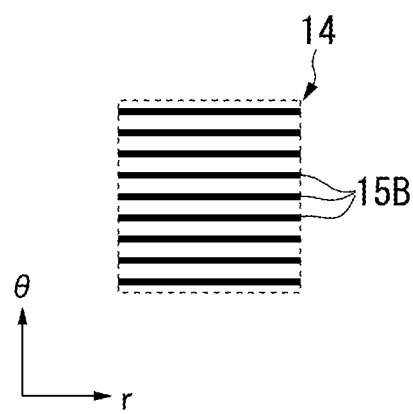
FIG. 5B is a schematic view illustrating a preferable example of the radiation member of the SiC epitaxial growth apparatus, and is a plan view of one surface side thereof.
Figure 5C:
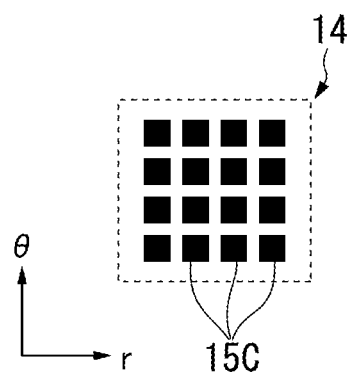
FIG. 5C is a schematic view illustrating a preferable example of the radiation member of the SiC epitaxial growth apparatus, and is a plan view of one surface side thereof.
Figure 5D:
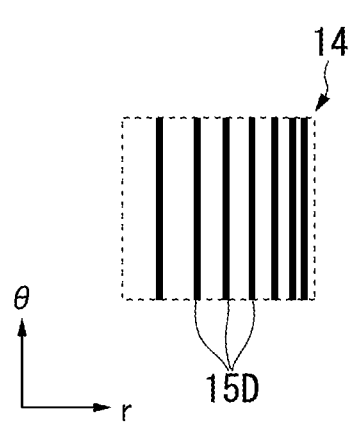
FIG. 5D is a schematic view illustrating a preferable example of the radiation member of the SiC epitaxial growth apparatus, and is a plan view of one surface side thereof.

FIGS. 5A to 5D are schematic views wherein the radiation members 14 having various surface shapes are observed from the surface 14b side in a plan view. In addition, since the radiation member has an annular shape, portions indicated by parallel straight lines in these figures may be curved and/or may not be parallel to each other. Among the directions indicated in the coordinates shown in FIGS. 5A to 5DT, the r direction is the radial direction, and the θ direction is a circumferential direction. As in the examples illustrated in FIGS. 5A to 5D, the shape of the recessed portion 15 is not particularly limited. For example, recessed portions 15A illustrated in FIG. 5A are formed concentrically. Recessed portions 15B illustrated in FIG. 5B are formed such that they extend radially from the center of the radiation member. Regarding recessed portions 15C illustrated in FIG. 5C, the recessed portions are dotted in the circumferential direction and the radial direction in the radiation member. Recessed portions 15D illustrated in FIG. 5D are formed concentrically such that the interval therebetween decreases toward the outer circumference. When the interval between the recessed portions 15D decreases toward the outer peripheral side, the temperature of the outer peripheral end portion can be efficiently increased.

The center supporting element 16 supports the center of the susceptor 10 from the back surface 10b side of the susceptor 10.

The center supporting element 16 is formed of a material having heat resistance to an epitaxial growth temperature. The center supporting element 16 may also be rotatable as a shaft extending from the center of the susceptor in the z direction. Epitaxial growth can be performed while rotating the wafer W by rotating the center supporting element 16.

As described above, with the SiC epitaxial growth apparatus 100 according to the first embodiment, the thermal uniformity of the wafer W in the in-plane direction can be enhanced. Since the radiation member 14 absorbs heat and reaches a high temperature, a decrease in the temperature of the outer peripheral portion of the wafer W is suppressed.

Second Embodiment

Figure 6:
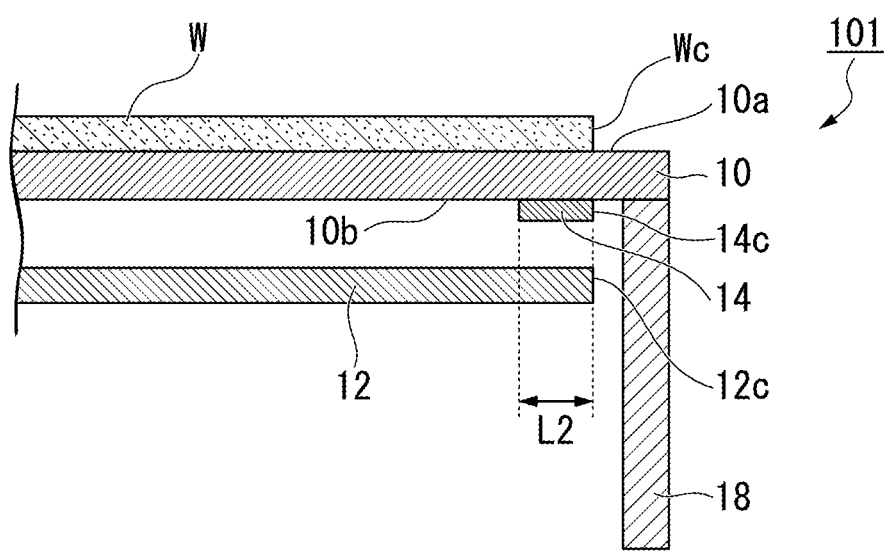
FIG. 6 is a schematic sectional view illustrating a preferable example of a SiC epitaxial growth apparatus according to a second embodiment, and is an enlarged view of a main part of the apparatus.

FIG. 6 is an enlarged schematic sectional view of a main part of a SiC epitaxial growth apparatus 101 according to a second embodiment. The SiC epitaxial growth apparatus 101 according to the second embodiment is different from that of the first embodiment only in that the susceptor 10 is supported not by the center supporting element 16 but by an outer periphery supporting element 18. The other configurations are almost the same as those of the SiC epitaxial growth apparatus 100 according to the first embodiment, and same configurations are denoted by the same reference numerals and the description thereof will be omitted. The heater may be supported by the center supporting element that supports the heater at the center portion. The outer periphery supporting element 18 may have a circular shape.

The outer periphery supporting element 18 supports the outer circumference portion of the susceptor 10 from the back surface 10b side of the susceptor 10.

The outer periphery supporting element 18 can be formed of the same material as that of the center supporting element 16.

A preferable range of a radial width L2 of the radiation member 14 which is included in the SiC epitaxial growth apparatus 101 according to the second embodiment is different from that of the SiC epitaxial growth apparatus 100 according to the first embodiment. The reason is that the susceptor 10 is supported by the outer periphery supporting element 18 and thus the outer periphery supporting element 18 also receives radiation from the heater.

In a case where the susceptor 10 is supported by the outer periphery supporting element 18, the radial width L2 of the radiation member 14 is preferably ¹⁄₂₀₀ or more and ⅓ or less of the radius of the wafer W. As necessary, the ratio may be ¹⁄₂₀₀ or more and less than ¹⁄₅₀, ¹⁄₅₀ or more and less than ¹⁄₁₅, or ¹⁄₁₅ or more and ⅓ or less. When the radial width L2 of the radiation member 14 is within the above range, the temperature of the wafer W in the in-plane direction can be made more uniform. The outer periphery supporting element 18 receives radiation from the heater 12 and generates heat. Therefore, compared to the case where the susceptor 10 is supported by the center supporting element 16, the radial width L2 of the radiation member 14 can be reduced.

Figure 7:
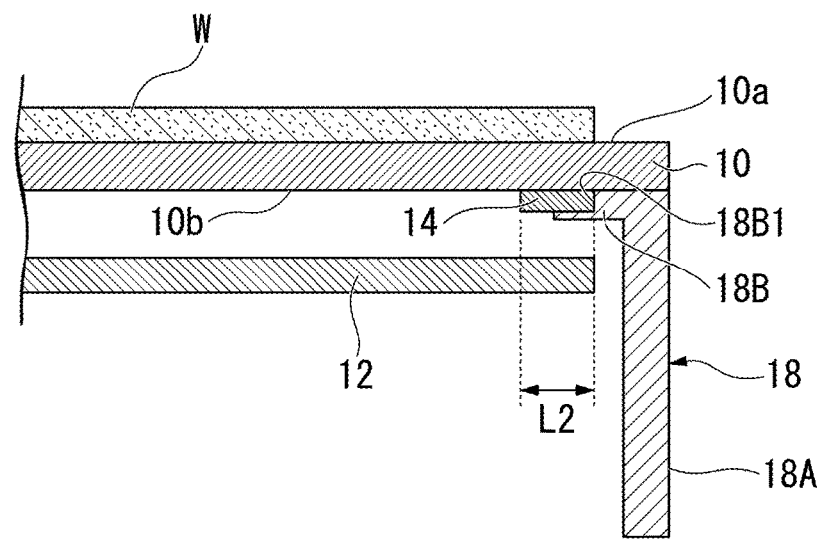
FIG. 7 is a schematic sectional view illustrating another preferable example of the SiC epitaxial growth apparatus according to the second embodiment, and is an enlarged view of a main part in which the radiation member is sandwiched and held between the susceptor and an outer periphery supporting element in the apparatus.

FIG. 7 is an enlarged schematic view of a main part of the SiC epitaxial growth apparatus according to the second embodiment in an example in which the radiation member 14 is sandwiched and held between the susceptor 10 and the outer periphery supporting element 18. The outer periphery supporting element 18 illustrated in FIG. 7 has a support column 18A and a protruding portion 18B. The support column 18A is a portion extending in the z direction and is a main portion of the outer periphery supporting element 18. The protruding portion 18B is a portion protruding from the support column 18A in the in-plane direction. The protruding portion 18B is provided with a fitting groove 18B1.

When the susceptor 10 is supported by the outer periphery supporting element 18, a gap is formed between the outer periphery supporting element 18 and the susceptor 10 due to the fitting groove 18B1. By inserting the radiation member 14 into the gap, the radiation member 14 is supported between the susceptor 10 and the outer periphery supporting element 18 by its own weight. Since the radiation member 14 can be supported by its own weight, an adhesive may be used or may not be used for the radiation member 14. The other portion of the radiation member 14 which is not exposed to the space is in contact with the susceptor 10 and the outer periphery supporting element 18 directly or via an adhesive or the like. In addition, when carbon having a coating is used as the material thereof, similar configuration can be formed after the coating is partially removed so that carbon is exposed.

In the SiC epitaxial growth apparatus 101 according to the second embodiment, the positional relationship between the outer peripheral end 12c of the heater 12 and the outer peripheral end Wc of the wafer W, and the positional relationship between the outer peripheral end 14c of the radiation member 14 and the outer peripheral end Wc of the wafer W can be set similar to those in the SiC epitaxial growth apparatus 100 according to the first embodiment. The surface of the radiation member 14 which is located on the heater 12 side may also be provided with an unevenness.

As described above, according to the SiC epitaxial growth apparatus 101 of the second embodiment, the thermal uniformity of the wafer W in the in-plane direction can be enhanced. As the radiation member 14 absorbs heat and the temperature thereof becomes high, a reduction in the temperature of the outer peripheral portion of the wafer W can be suppressed.

While the preferred embodiments of the present invention have been described above in detail, the present invention is not limited to the specific embodiments, and various changes and modifications may be made without departing from the scope of the present invention described in the claims.

EXAMPLES

Example 1

A temperature state of the surface of a wafer, which is observed when the SiC epitaxial growth apparatus having the configuration illustrated in FIG. 2 is used, was obtained by a simulation. For the simulation, ANSYS Mechanical (manufactured by ANSYS Co., Ltd.) which is a general-purpose FEM thermal analysis software was used.

In the simulation, the emissivity of the susceptor 10 was set to 0.2 (corresponding to that of carbon which is coated with TaC), and the emissivity of the radiation member 14 was set to 0.8 (corresponding to that of carbon which is coated with SiC). The radial width L1 of the radiation member 14 was set to 10 mm. In addition, in the plan view observed from the z direction, the outer peripheral end Wc of the wafer W, the outer peripheral end 14c of the radiation member 14, and the outer peripheral end 12c of the heater 12 were allowed to coincide. The distance between the heater 12 and the back surface 10b of the susceptor 10 was set to 15 mm. The radius (r) of the wafer was set to 100 mm. The in-plane distribution of the surface temperature of the wafer was obtained based on the above conditions.

Example 2

Example 2 is different from Example 1 in that the radial width L1 of the radiation member 14 was set to 20 mm. The other conditions were the same as in Example 1.

Example 3

Example 3 is different from Example 1 in that the radial width L1 of the radiation member 14 was set to 30 mm.

The other conditions were the same as in Example 1.

Comparative Example 1

Comparative Example 1 is different from Example 1 in that the radiation member 14 was not provided. The other conditions were the same as in Example 1.

Figure 8:
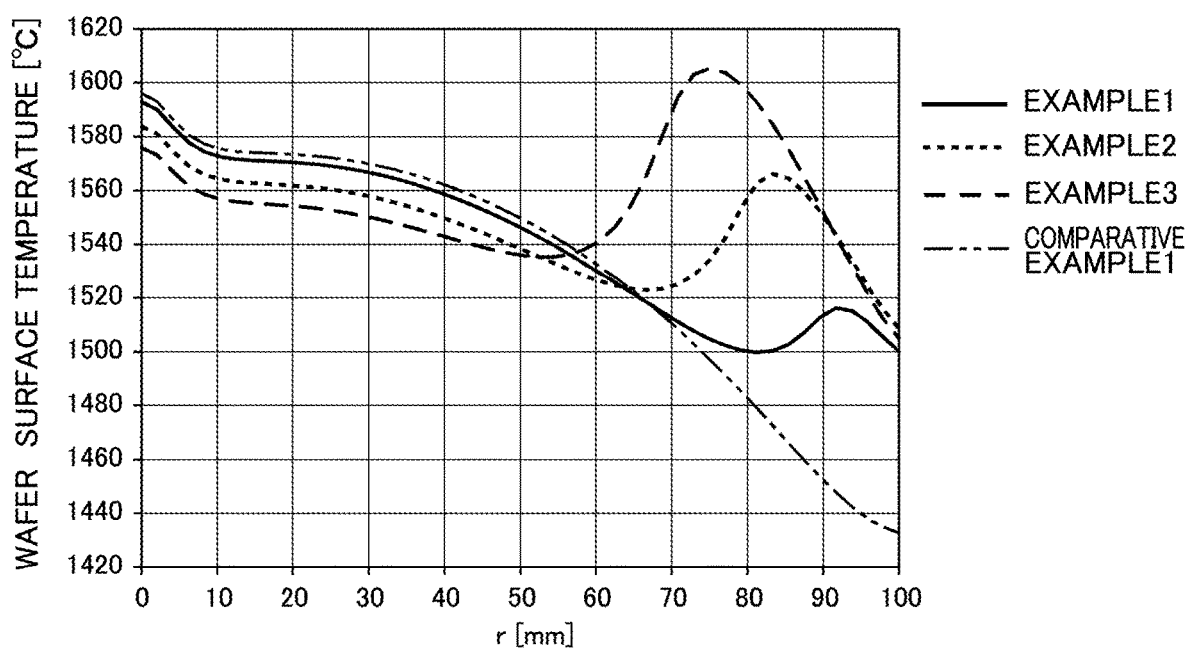
FIG. 8 is a diagram showing temperature distributions of the surface of wafers in Examples 1 to 3 and Comparative Example 1.

FIG. 8 is a diagram showing temperature distributions of the surface of wafers of Examples 1 to 3 and Comparative Example 1. The horizontal axis represents the radial position of the wafer from the center, and the vertical axis represents the surface temperature of the wafer at the position of the wafer. As shown in FIG. 8, by bringing the radiation member 14 into contact with the back surface of the susceptor 10, a decrease in the temperature of the wafer at the outer peripheral side was suppressed.

Example 4

Example 4 is different from Example 2 in that the emissivity of the radiation member 14 was set to 0.3. The other conditions were the same as in Example 2.

Figure 9:
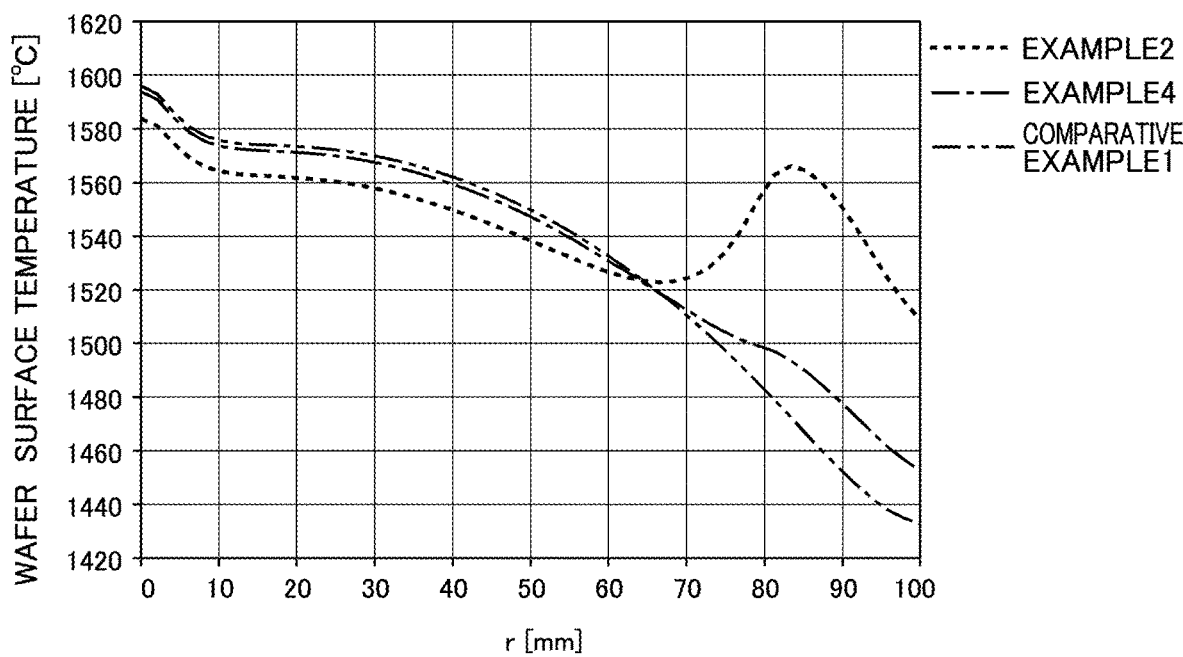
FIG. 9 is a diagram showing temperature distributions of the surface of wafers in Examples 2 and 4 and Comparative Example 1.

FIG. 9 is a diagram showing temperature distributions of the surface of wafers of Examples 2 and 4 and Comparative Example 1. The horizontal axis represents the radial position of the wafer from the center, and the vertical axis represents the surface temperature of the wafer at the position. As shown in FIG. 9, even in a case where the radiation member 14 having a small emissivity was used, a decrease in the temperature of the wafer at the outer peripheral side was suppressed.

Comparative Example 2

Comparative Example 2 is different from Example 4 in that the radiation member 14 and the susceptor 10 were not in contact with each other. The other conditions were the same as in Example 4.

Figure 10:
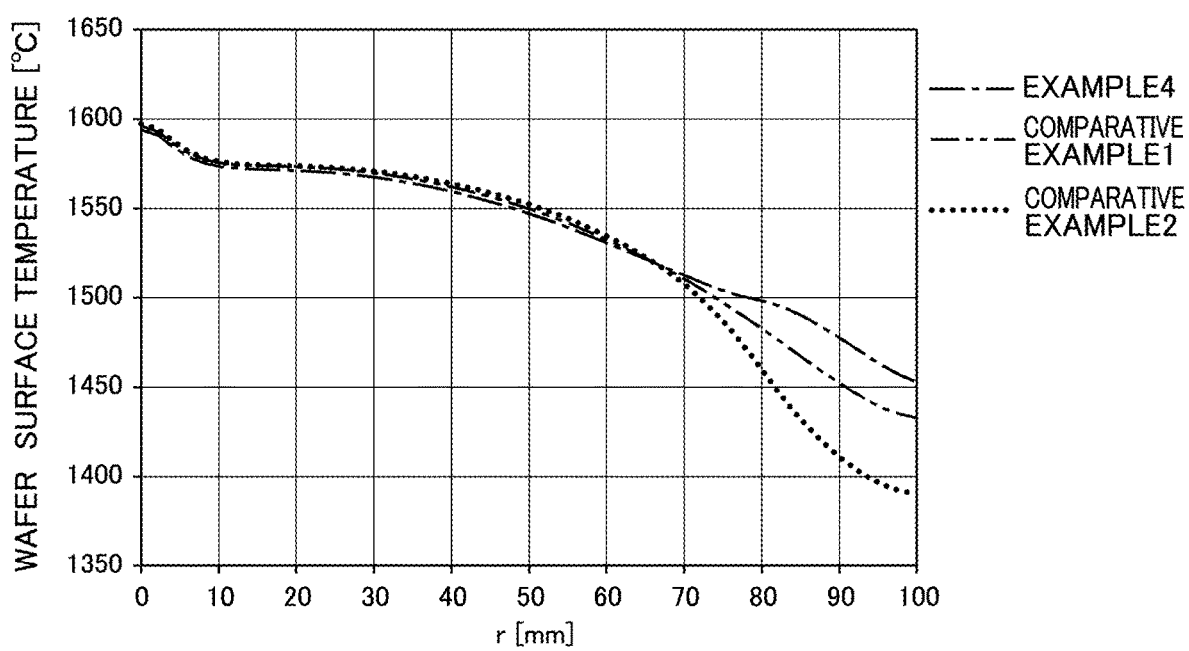
FIG. 10 is a diagram showing temperature distributions of the surface of wafers in Example 4 and Comparative Examples 1 and 2.

FIG. 10 is a diagram showing temperature distributions of the surface of wafers of Example 4 and Comparative Examples 1 and 2.

The horizontal axis represents the radial position of the wafer from the center, and the vertical axis represents the surface temperature of the wafer at the position. As shown in FIG. 10, in Comparative Example 2 in which the radiation member 14 was not in contact, a decrease in the temperature of the wafer at the outer peripheral side was not suppressed.

Example 5

Example 5 is different from Example 4 in that an uneven shape was provided on the surface of the radiation member 14 on the heater side. The other conditions were the same as in Example 4. As the unevenness, 20 grooves having a groove width and an interval of 0.2 mm and a depth of 1.0 mm were provided.

Figure 11:
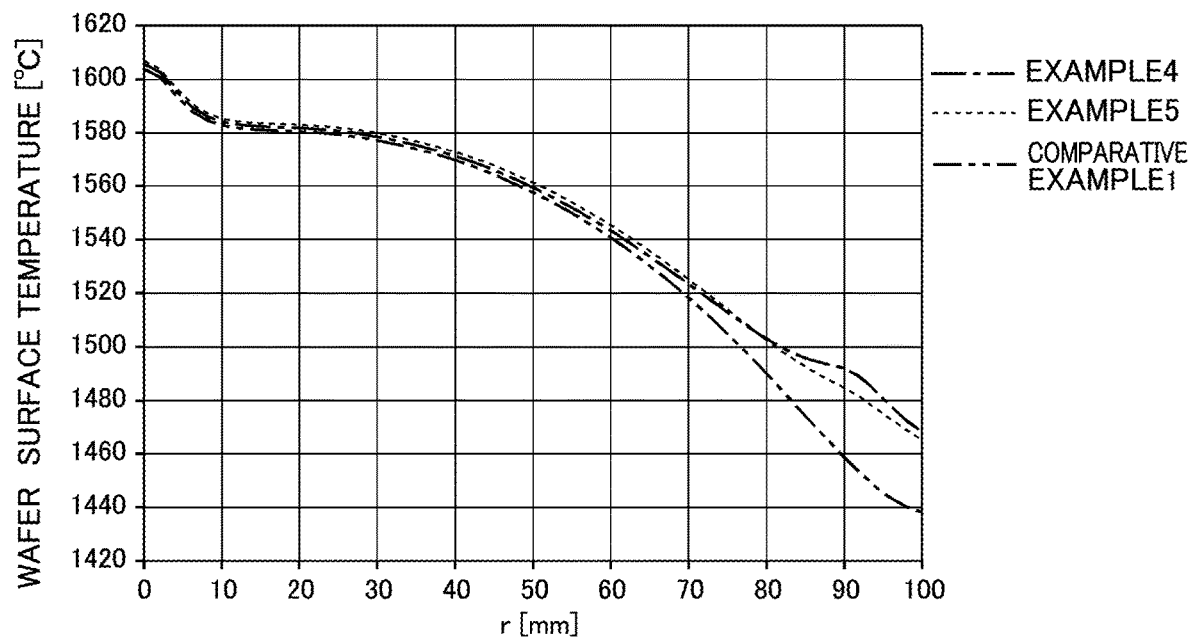
FIG. 11 is a diagram showing temperature distributions of the surface of the wafers in Examples 4 and 5 and Comparative Example 1.

FIG. 11 is a diagram showing temperature distributions of the surface of wafers of Examples 4 and 5 and Comparative Example 1.

The horizontal axis represents the radial position of the wafer from the center, and the vertical axis represents the surface temperature of the wafer at the position. As shown in FIG. 11, by providing the uneven shape in the radiation member 14, a decrease in the temperature of the wafer at the outer peripheral side was further suppressed.

Example 6

Example 6 is different from Example 1 in that the SiC epitaxial growth apparatus having the configuration illustrated in FIG. 3 was used and the radiation member 14 was engaged with the susceptor 10. The radial width L1 of the radiation member 14 was set to 10 mm which is the width of an exposed portion of the radiation member exposed to the heater 12 side. The other conditions were the same as in Example 1.

Example 7

Example 7 is different from Example 6 in that the radial width L1 of the radiation member 14 was set to 20 mm.

The other conditions were the same as in Example 6.

Figure 12:
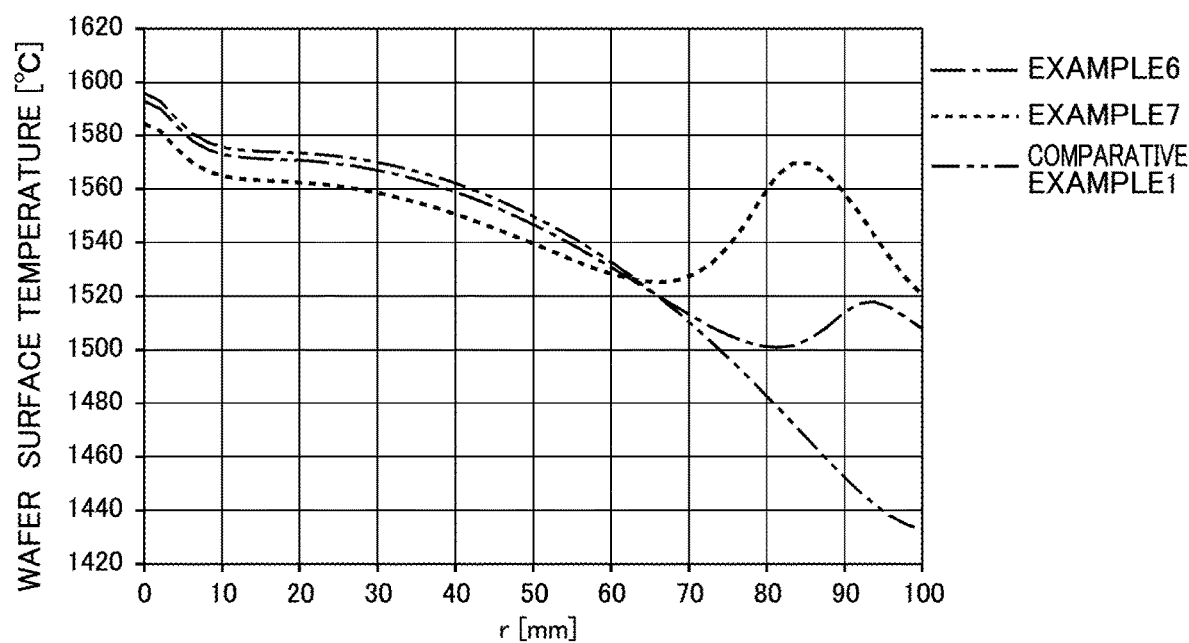
FIG. 12 is a diagram showing temperature distributions of the surface of wafers in Examples 6 and 7 and Comparative Example 1.

FIG. 12 is a diagram showing temperature distributions of the surface of wafers of Examples 6 and 7 and Comparative Example 1.

The horizontal axis represents the radial position of the wafer from the center, and the vertical axis represents the surface temperature of the wafer at the position. As shown in FIG. 12, even in the configuration illustrated in FIG. 3, by bringing the radiation member 14 into contact with the back surface of the susceptor 10, a decrease in the temperature of the wafer from the outer peripheral side was suppressed.

Table 1 summarizes the results of the investigation. An in-plane temperature difference dT means the temperature difference between the maximum value and the minimum value of the temperature in the surface of the wafer.

Figure 13:
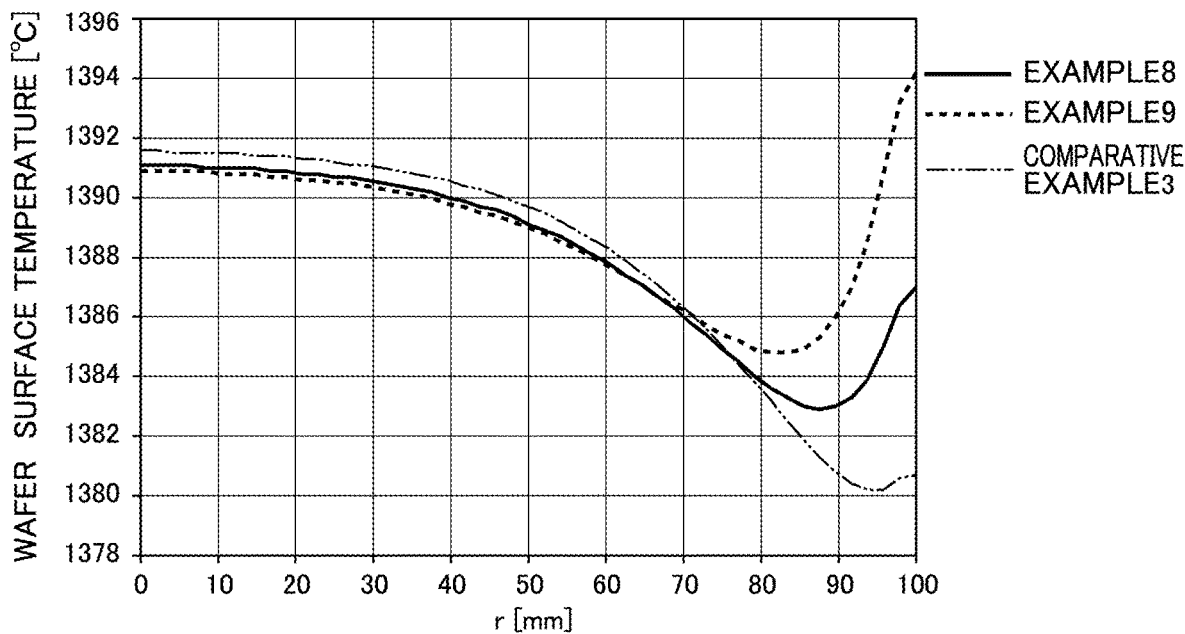
FIG. 13 is a diagram showing temperature distributions of the surface of wafers in Examples 8 and 9 and Comparative Example 3.

FIG. 13 is a diagram showing temperature distributions of the surface of wafers of Examples 8 and 9 and Comparative Example 3.

The horizontal axis represents the radial position of the wafer from the center, and the vertical axis represents the surface temperature of the wafer at the position. As shown in FIG. 13, even in a case where the SiC epitaxial growth apparatus having the configuration illustrated in FIG. 6 was used, by bringing the radiation member 14 into contact with the back surface of the susceptor 10, a decrease in the temperature of the wafer at the outer peripheral side was suppressed.

Example 10

Example 10 is different from Example 8 in that the emissivity of the radiation member 14 was set to 0.3, and the radial width L2 of the radiation member 14 was set to 2 mm. The other conditions were the same as in Example 8.

Example 11

Example 11 is different from Example 10 in that the radial width L2 of the radiation member 14 was set to 20 mm. The other conditions were the same as in Example 10.

TABLE 1

| | Emissivity of radiation member | Width (L1) of radiation member | Presence or absence of contact | Presence or absence of unevenness | Apparatus configuration | In-plane temperature difference dT (° C.) |
|---|---|---|---|---|---|---|
| Example 1 | 0.8 | 10 | Contact | Absent | FIG. 2 | 93 |
| Example 2 | 0.8 | 20 | Contact | Absent | FIG. 2 | 75 |
| Example 3 | 0.8 | 30 | Contact | Absent | FIG. 2 | 100 |
| Example 4 | 0.3 | 20 | Contact | Absent | FIG. 2 | 141 |
| Example 5 | 0.3 | 20 | Contact | Present | FIG. 2 | 137 |
| Example 6 | 0.8 | 10 | Contact | Absent | FIG. 3 | 92 |
| Example 7 | 0.8 | 20 | Contact | Absent | FIG. 3 | 64 |
| Comparative Example 1 | — | — | — | — | FIG. 2 | 163 |
| Comparative Example 2 | 0.3 | 20 | Non-contact | Absent | FIG. 2 | 207 |

Example 8

A temperature state of the surface of wafers, which is obtained when the SiC epitaxial growth apparatus having the configuration illustrated in FIG. 6 was used, was obtained by a simulation. That is, Example 8 is different from Example 1 in that the susceptor was supported not by the center supporting element 16 but by the outer periphery supporting element 18. The radial width L2 of the radiation member 14 was set to 0.5 mm. The other conditions were the same as in Example 1.

Example 9

Example 9 is different from Example 8 in that the radial width L2 of the radiation member 14 was set to 1 mm. The other conditions were the same as in Example 8.

Comparative Example 3

Comparative Example 3 is different from Example 8 in that the radiation member 14 was not provided. The other conditions were the same as in Example 8.

Figure 14:
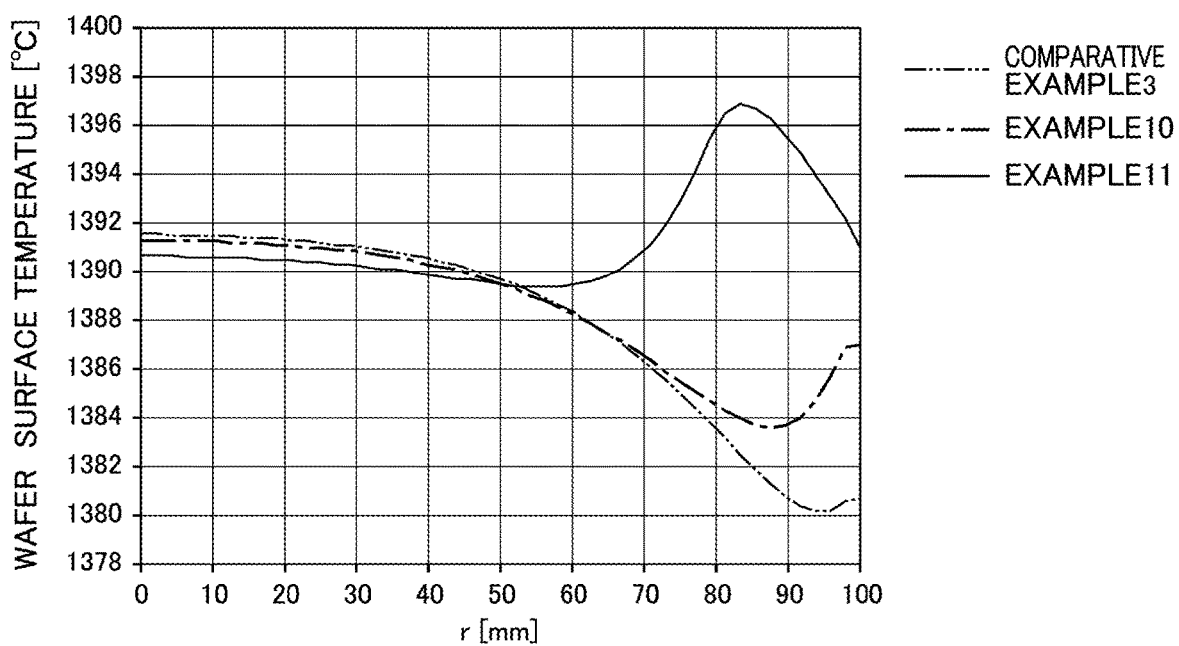
FIG. 14 is a diagram showing temperature distributions of the surface of wafers in Examples 10 and 11 and Comparative Example 3.

FIG. 14 is a diagram showing temperature distributions of the surface of wafers in Examples 10 and 11 and Comparative Example 3. The horizontal axis represents the radial position of the wafer from the center, and the vertical axis represents the surface temperature of the wafer at the position. As shown in FIG. 14, even in a case where the radiation member 14 having a small emissivity was used, a decrease in the temperature of the wafer at the outer peripheral side was suppressed.

Comparative Example 4

Comparative Example 4 is different from Example 10 in that the radiation member 14 and the susceptor 10 were not in contact with each other. The other conditions were the same as in Example 10.

Figure 15:
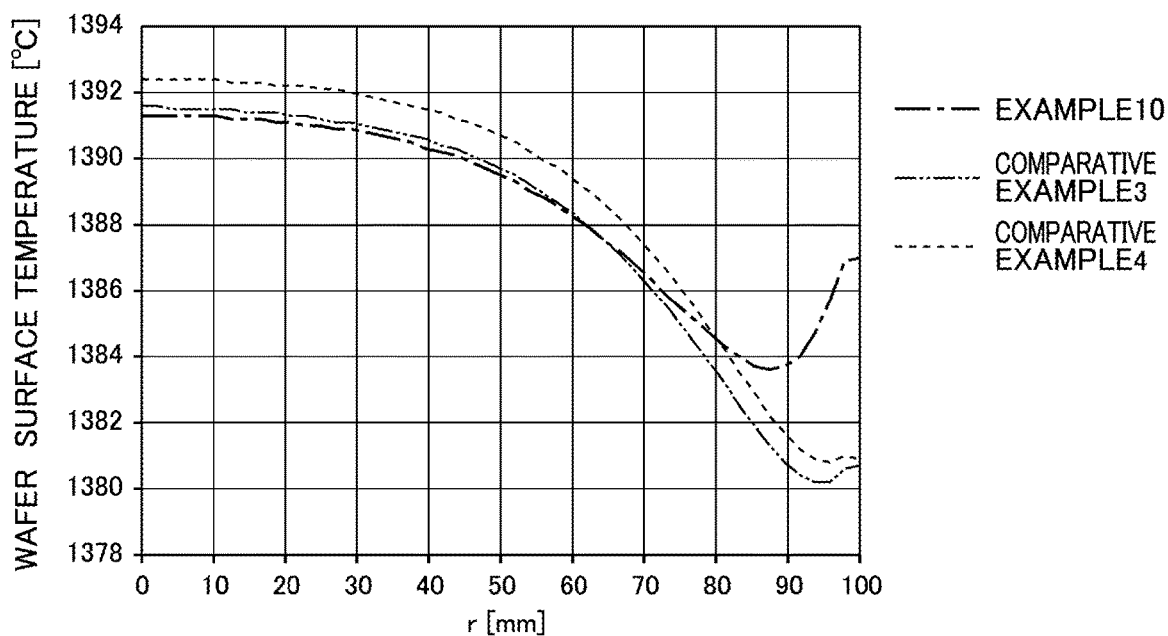
FIG. 15 is a diagram showing temperature distributions of the surface of wafers in Example 10 and Comparative Examples 3 and 4.

FIG. 15 is a diagram showing temperature distributions of the surface of wafers in Example 10 and Comparative Examples 3 and 4. The horizontal axis represents the radial position of the wafer from the center, and the vertical axis represents the surface temperature of the wafer at the position. As shown in FIG. 15, in Comparative Example 4 in which the radiation member 14 was not in contact, a decrease in the temperature of the wafer at the outer peripheral side could not be sufficiently suppressed.

Example 12

Example 12 is different from Example 10 in that an uneven shape was provided on the surface of the radiation member 14 on the heater side. The other conditions were the same as in Example 10. As the unevenness, five grooves having a groove width and an interval of 0.1 mm and a depth of 0.2 mm were provided.

Figure 16:
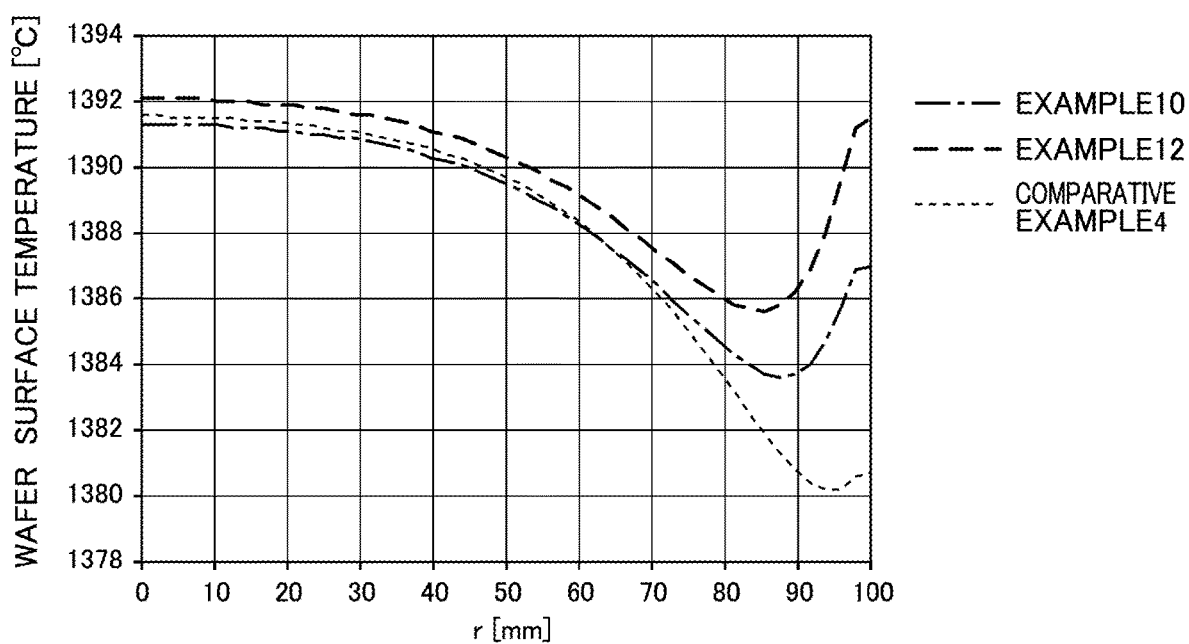
FIG. 16 is a diagram showing temperature distributions of the surface of wafers in Examples 10 and 12 and Comparative Example 4.

FIG. 16 is a diagram showing temperature distributions of the surface of wafers of Examples 10 and 12 and Comparative Example 4. The horizontal axis represents the radial position of the wafer from the center, and the vertical axis represents the surface temperature of the wafer at the position. As shown in FIG. 16, by providing the uneven shape in the radiation member 14, a decrease in the temperature of the wafer at the outer peripheral side was further suppressed.

Example 13

Example 13 is different from Example 8 in that the SiC epitaxial growth apparatus having the configuration illustrated in FIG. 7 was used and the radiation member 14 was engaged with the susceptor 10. The radial width L2 of the radiation member 14 exposed to the heater 12 side was set to 0.5 mm. The other conditions were the same as in Example 8.

Example 14

Example 14 is different from Example 13 in that the radial width L2 of the radiation member 14 was set to 1 mm. The other conditions were the same as in Example 13.

Comparative Example 5

Comparative Example 5 is different from Example 13 in that the SiC epitaxial growth apparatus having the configuration illustrated in FIG. 7 was used and the radiation member 14 was not provided. The other conditions were the same as in Example 13.

Figure 17:
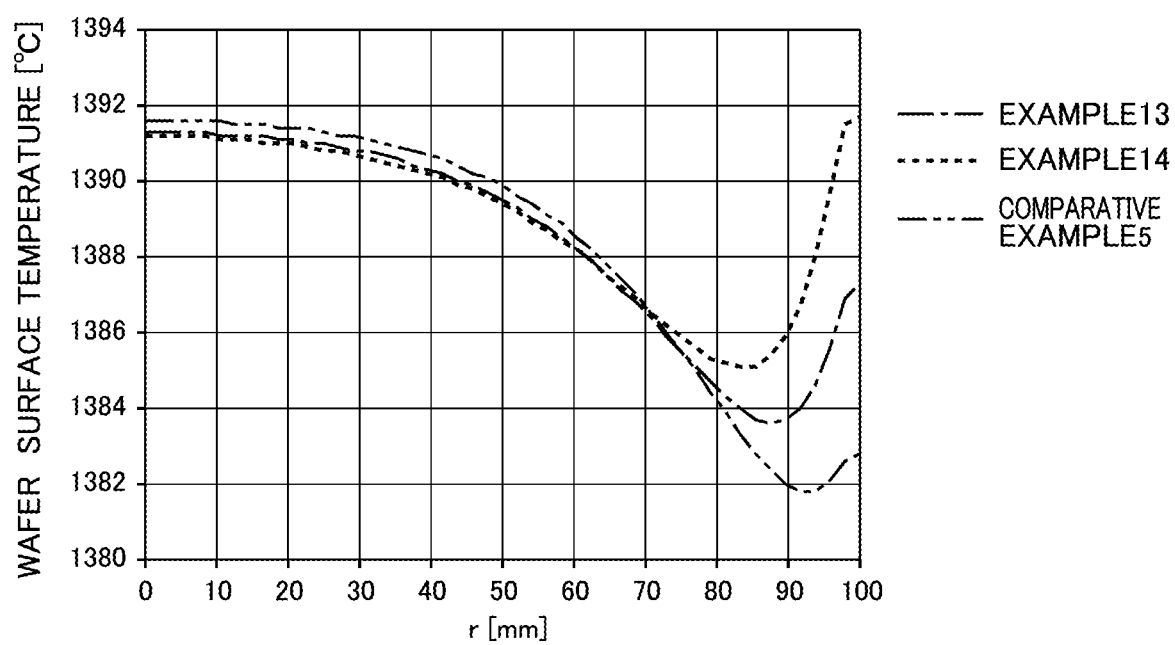
FIG. 17 is a diagram showing temperature distributions of the surface of wafers in Examples 13 and 14 and Comparative Example 5.

FIG. 17 is a diagram showing temperature distributions of the surface of wafers of Examples 13 and 14 and Comparative Example 5. The horizontal axis represents the radial position of the wafer from the center, and the vertical axis represents the surface temperature of the wafer at the position. As shown in FIG. 17, even in the configuration illustrated in FIG. 7, by bringing the radiation member 14 into contact with the back surface of the susceptor 10, a decrease in the temperature of the wafer at the outer peripheral side was suppressed.

Table 2 summarizes these results.

TABLE 2

|  | Emissivity of radiation member | Width (L2) of radiation member | Presence or absence of contact | Presence or absence of unevenness | Apparatus configuration | In-plane temperature difference dT (° C.) |
|---|---|---|---|---|---|---|
| Example 8 | 0.8 | 0.5 | Contact | Absent | FIG. 6 | 8.2 |
| Example 9 | 0.8 | 1.0 | Contact | Absent | FIG. 6 | 9.4 |
| Example 10 | 0.3 | 2.0 | Contact | Absent | FIG. 6 | 7.7 |
| Example 11 | 0.3 | 20 | Contact | Absent | FIG. 6 | 7.5 |
| Example 12 | 0.3 | 2.0 | Contact | Present | FIG. 6 | 6.5 |
| Example 13 | 0.8 | 0.5 | Contact | Absent | FIG. 7 | 7.7 |
| Example 14 | 0.8 | 1.0 | Contact | Absent | FIG. 7 | 6.6 |
| Comparative Example 3 | — | — | — | — | FIG. 6 | 11.4 |
| Comparative Example 4 | 0.3 | 30 | Non-contact | Absent | FIG. 6 | 11.6 |
| Comparative Example 5 | — | — | — | — | FIG. 7 | 9.8 |

As described above, according to the present invention, it is possible to obtain a SiC epitaxial growth apparatus capable of uniformizing a temperature distribution during epitaxial growth.

EXPLANATION OF REFERENCES

1: chamber
2: gas supply port
3: gas discharge port
10: susceptor
10a: mounting surface of susceptor
10b: back surface of susceptor
10A: first member
10A1: main portion of first member
10A2: protruding portion of first member
10B: second member
10B1: main portion of second member
10B2: protruding portion of second member
12: heater
12c: outer peripheral end of heater
14: radiation member
14A: first portion of radiation member
14B: second portion of radiation member
14b: one surface of radiation member
14c: outer peripheral end of radiation member
15, 15A, 15B, 15C, 15D: recessed portion
16: center supporting element
18: outer periphery supporting element
18A: support column of outer periphery supporting element
18B: protruding portion of outer periphery supporting element
18B1: fitting groove of outer periphery supporting element
100, 101: SiC epitaxial growth apparatus
W: wafer
Wc: outer peripheral end of wafer
K: film formation space L1, L2: radial width of radiation member
G: gas

The invention claimed is:

1. A SiC epitaxial growth apparatus comprising:
a susceptor having a mounting surface on which a wafer is placable;
a heater which is provided apart from the susceptor on a side opposite to the mounting surface of the susceptor; and
an annular radiation member which is in contact with a back surface of the susceptor opposite to the mounting surface, and is located at a position which is overlapped with an outer peripheral portion of the wafer placed on the susceptor in a plan view,
wherein the radiation member has a higher emissivity than that of the susceptor and has an exposed portion when viewed from the heater.

2. The SiC epitaxial growth apparatus according to claim 1,
wherein the heater and the wafer placed on the susceptor are disposed concentrically with each other, and a radial distance between an outer peripheral end of the heater and an outer peripheral end of the wafer placed on the susceptor is $1/12$ or less of a diameter of the wafer in the plan view.

3. The SiC epitaxial growth apparatus according to claim 1,
wherein the radiation member and the wafer placed on the susceptor are disposed concentrically with each other, and a radial distance between an outer peripheral end of the radiation member and an outer peripheral end of the wafer placed on the susceptor is $1/6$ or less of a diameter of the wafer in the plan view.

4. The SiC epitaxial growth apparatus according to claim 1,
wherein the emissivity of the radiation member is 1.5 times or more the emissivity of the susceptor.

5. The SiC epitaxial growth apparatus according to claim 1, further comprising:
a center supporting element which supports a center portion of the susceptor from the back surface.

6. The SiC epitaxial growth apparatus according to claim 5,
wherein a radial width of the radiation member is $1/10$ or more and $1/3$ or less of a radius of the wafer placed on the susceptor.

7. The SiC epitaxial growth apparatus according to claim 1,
wherein the radiation member is engaged with the susceptor.

8. The SiC epitaxial growth apparatus according to claim 1, further comprising:
an outer periphery supporting element which supports an outer peripheral end portion of the susceptor from the back surface.

9. The SiC epitaxial growth apparatus according to claim 8,
wherein a radial width of the radiation member is $1/200$ or more and $1/5$ or less of a radius of the wafer placed on the susceptor.

10. The SiC epitaxial growth apparatus according to claim 8,
wherein the radiation member is sandwiched and held between the susceptor and the outer periphery supporting element such that a portion of the radiation member is exposed as viewed from the heater.

11. The SiC epitaxial growth apparatus according to claim 1,
wherein an unevenness is formed on a surface of the radiation member on the heater side.

* * * * *